(12) United States Patent
Kawahara et al.

(10) Patent No.: US 9,373,570 B2
(45) Date of Patent: Jun. 21, 2016

(54) SEMICONDUCTOR MODULE AND DRIVING DEVICE FOR SWITCHING ELEMENT

(71) Applicant: DENSO CORPORATION, Kariya, Aichi-pref. (JP)

(72) Inventors: Hideki Kawahara, Kariya (JP); Takanori Imazawa, Nisshin (JP)

(73) Assignee: DENSO CORPORATION, Kariya (JP)

( * ) Notice: Subject to any disclaimer, the term of this patent is extended or adjusted under 35 U.S.C. 154(b) by 247 days.

(21) Appl. No.: 14/267,513

(22) Filed: May 1, 2014

(65) Prior Publication Data

US 2014/0346635 A1 Nov. 27, 2014

(30) Foreign Application Priority Data

May 23, 2013 (JP) ................................. 2013-108924

(51) Int. Cl.
*H01L 23/495* (2006.01)
*H03K 19/01* (2006.01)
(Continued)

(52) U.S. Cl.
CPC ........ *H01L 23/49562* (2013.01); *H01L 23/495* (2013.01); *H01L 24/36* (2013.01); *H01L 24/40* (2013.01); *H03K 17/04* (2013.01); *H03K 19/01* (2013.01); *H01L 2224/40137* (2013.01); *H01L 2224/48091* (2013.01); *H01L 2224/48095* (2013.01); *H01L 2224/48247* (2013.01); *H01L 2924/12035* (2013.01); *H01L 2924/1305* (2013.01); *H01L 2924/13055* (2013.01); *H01L 2924/13091* (2013.01); *H01L 2924/181* (2013.01)

(58) Field of Classification Search
CPC ............ H03K 17/04; H03K 17/04106; H03K 17/04113; H03K 17/0412; H03K 17/04123; H03K 17/04126; H03K 19/01
See application file for complete search history.

(56) References Cited

U.S. PATENT DOCUMENTS 3,474,307 A * 10/1969 Abe ....................... H01L 23/055
257/256
4,454,485 A * 6/1984 Fisher .................... H03B 5/124
331/109

(Continued)

FOREIGN PATENT DOCUMENTS

JP 10-225135 A 8/1998
JP 2000-134075 A 5/2000

(Continued)

OTHER PUBLICATIONS

Office Action mailed May 12, 2015 issued in corresponding JP patent application No. 2013-108924 (and English translation).

*Primary Examiner* — Thomas J Hiltunen
(74) *Attorney, Agent, or Firm* — Posz Law Group, PLC

(57) ABSTRACT

A semiconductor module includes: a semiconductor element; first and second main current passages for energizing the semiconductor element, the first and second main current passages being opposed to each other in such a manner that a first energization direction of the first main current passage is opposite to a second energization direction of the second main current passage, or an angle between the first energization direction and the second energization direction is an obtuse angle; and a coil unit sandwiched between the first and second main current passages. The coil unit includes a coil, which generates an induced electromotive force when a magnetic flux interlinks with the coil, the magnetic flux being generated when current flows through the first and second main current passages.

9 Claims, 9 Drawing Sheets

(51) Int. Cl.
*H03K 17/04* (2006.01)
*H01L 23/00* (2006.01)

(56) References Cited

U.S. PATENT DOCUMENTS

| | | | |
|---|---|---|---|
| 5,202,619 A | 4/1993 | Furuhata et al. | |
| 5,621,257 A * | 4/1997 | Kawakami | H02M 1/08 307/116 |
| 6,373,731 B1 * | 4/2002 | Iwamura | H02M 1/34 361/91.1 |
| 6,703,707 B1 | 3/2004 | Mamitsu et al. | |
| 7,091,753 B2 * | 8/2006 | Inoshita | H02M 1/08 327/108 |
| 9,203,399 B2 * | 12/2015 | Yamaguchi | H03K 17/04206 |
| 2002/0175719 A1 * | 11/2002 | Cohen | H02M 1/088 327/108 |
| 2003/0132530 A1 | 7/2003 | Teshima et al. | |
| 2004/0017245 A1 | 1/2004 | Mochizuki | |
| 2007/0018197 A1 | 1/2007 | Mochida et al. | |
| 2013/0015496 A1 | 1/2013 | Konno et al. | |
| 2014/0306739 A1 | 10/2014 | Yamaguchi et al. | |
| 2015/0061731 A1 * | 3/2015 | Tabata | H03K 17/167 327/109 |

FOREIGN PATENT DOCUMENTS

| | | |
|---|---|---|
| JP | 2004-063687 A | 2/2004 |
| JP | 2006-025071 A | 1/2006 |
| JP | 2008-235997 A | 10/2008 |
| JP | 2011-041401 A | 2/2011 |
| JP | 2013-021107 A | 1/2013 |
| JP | 2013-110684 A | 6/2013 |
| WO | 2013/076916 A1 | 5/2013 |

* cited by examiner

SEMICONDUCTOR MODULE AND DRIVING DEVICE FOR SWITCHING ELEMENT

CROSS REFERENCE TO RELATED APPLICATION

This application is based on Japanese Patent Application No. 2013-108924 filed on May 23, 2013, the disclosure of which is incorporated herein by reference.

TECHNICAL FIELD

The present disclosure relates to a semiconductor module having a coil mounted in a semiconductor chip, and a driving device for a switching element in a semiconductor module.

BACKGROUND

For example, a driving device as a semiconductor device for a switching element turns on and off the switching element by controlling a voltage applied to a control terminal of the switching element. In this case, a main factor for determining an on time and an off time of the switching element relates to a charging and discharging time according to a parasitic capacitance.

The charging time of the parasitic capacitance is determined by a magnitude of current to flow into a control terminal of the switching element from a driving circuit. Accordingly, in order to shorten the charging time, the current to flow into the control terminal is increased. In view of this technique, an applied voltage of the control terminal of the switching element is, for example, forcibly controlled to be closer to a power source voltage.

Thus, the driving circuit according to the prior art provides a high speed switching operation by increasing the current flowing through the parasitic capacitor from the control terminal of the switching element. However, in this case, it is necessary to increase a current supply capacity of the driving circuit. In order to solve this difficulty, JP-A-2008-235997 describes that an inductor is arranged around a current path, through which a main current of the switching element flows. An induced electromotive force generated at the inductor is overlapped on an applied voltage of the control terminal of the switching element. This operation provides a high speed operation of the switching element without increasing the current supply capacity of the driving circuit.

In order to put the technique in JP-A-2008-235997 into practical use, an arrangement of the inductor with respect to the main current path is a point of the technique. In JP-A-2008-235997, a ferrite core having a ring shape and a coil wound around the core are used. In this case, the core has the ring shape, and the core is arranged to be spaced apart from a lead. Therefore, it is difficult to fix the coil.

SUMMARY

It is an object of the present disclosure to provide a semiconductor module having a coil easily fixed and a driving device for a switching element in a semiconductor module.

According to a first aspect of the present disclosure, a semiconductor module includes: a semiconductor element; first and second main current passages for energizing the semiconductor element, the first and second main current passages being opposed to each other in such a manner that a first energization direction of the first main current passage is opposite to a second energization direction of the second main current passage, or an angle between the first energization direction and the second energization direction is an obtuse angle; and a coil unit sandwiched between the first and second main current passages. The coil unit includes a coil, which generates an induced electromotive force when a magnetic flux interlinks with the coil, the magnetic flux being generated when current flows through the first and second main current passages.

In the above module, the first and second main current passages flows main current of the semiconductor element. The first and second main current passages are opposed to each other, and the first energization direction of the first main current passage is opposite to the second energization direction of the second main current passage, or the angle between the first energization direction and the second energization direction is the obtuse angle. In this case, when the main current flows through the first main current passage in the first energization direction, a first magnetic field is generated in a right-turn around the first energization direction. When the main current flows through the second main current passage in the second energization direction, a second magnetic field is generated in a right-turn around the second energization direction. Thus, the first magnetic field and the second magnetic field are enhanced each other in a region between the first and second main current passages. The first magnetic field and the second magnetic field are weakened each other in a region other than the region between the first and second main current passages.

The coil unit is arranged between the first and second main current passages so that the magnetic flux generated by the energization through the first and second main current passages interlinks with the coil unit. Accordingly, the induced electromotive voltage is generated at the coil unit according to the magnetic field enhanced by the first and second magnetic field. The induced electromotive voltage may be used for various circuits. Since the coil unit is sandwiched between the first and second main current passages, the coil unit is easily fixed.

According to a second aspect of the present disclosure, a driving device for driving a switching element includes: a semiconductor element, which is the switching element having a gate, a drain or a collector, and a source or an emitter. The semiconductor element is energized by first and second main current passages. The first and second main current passages are opposed to each other in such a manner that a first energization direction of the first main current passage is opposite to a second energization direction of the second main current passage, or an angle between the first energization direction and the second energization direction is an obtuse angle. A coil unit is sandwiched between the first and second main current passages. The coil unit includes a coil, which generates an induced electromotive force when a magnetic flux interlinks with the coil, the magnetic flux being generated when current flows through the first and second main current passages. The gate, the drain or the collector and the source or the emitter are electrically connected to each other so as to be coupled in a mutual induction manner. An induced electromotive voltage generated at the coil unit is overlapped on an applied voltage of the gate.

In the above driving device, the induced electromotive voltage is overlapped on the applied voltage of the gate in the switching element, so that the driving device provides the high switch speed.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

A semiconductor module and a driving device of a switching element will be explained with reference to the drawings. In each embodiment, when an element is the same as or a similar to another element, the same reference number may be put, and an explanation of the element may be skipped.

(First Embodiment)

Figure 1:
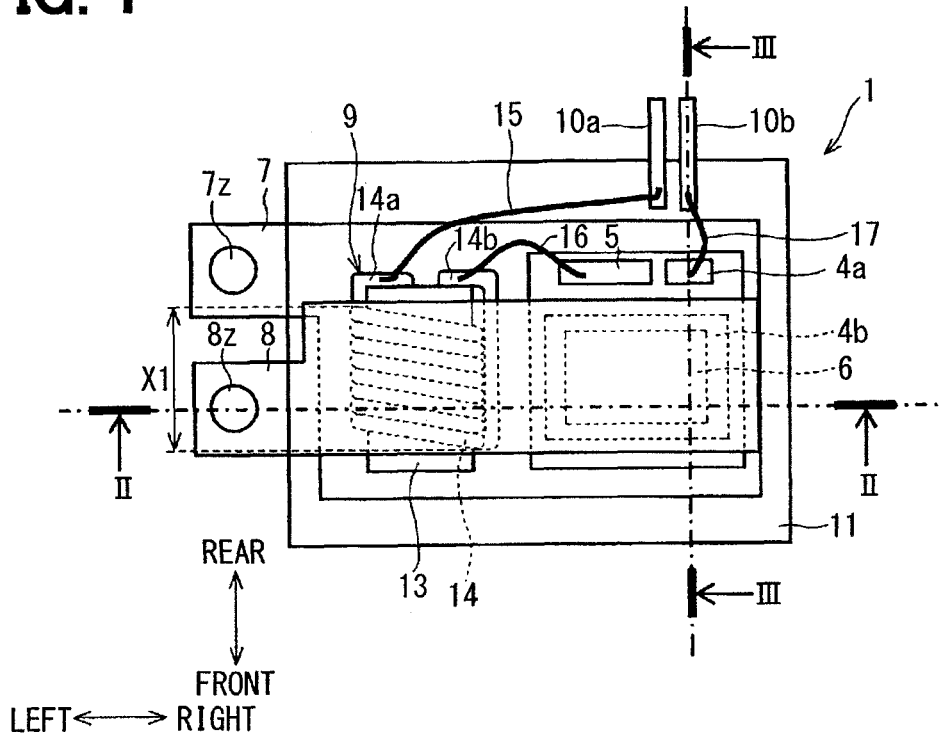
FIG. 1 is a diagram showing a plan view of a semiconductor module according to a first embodiment.
Figure 2:
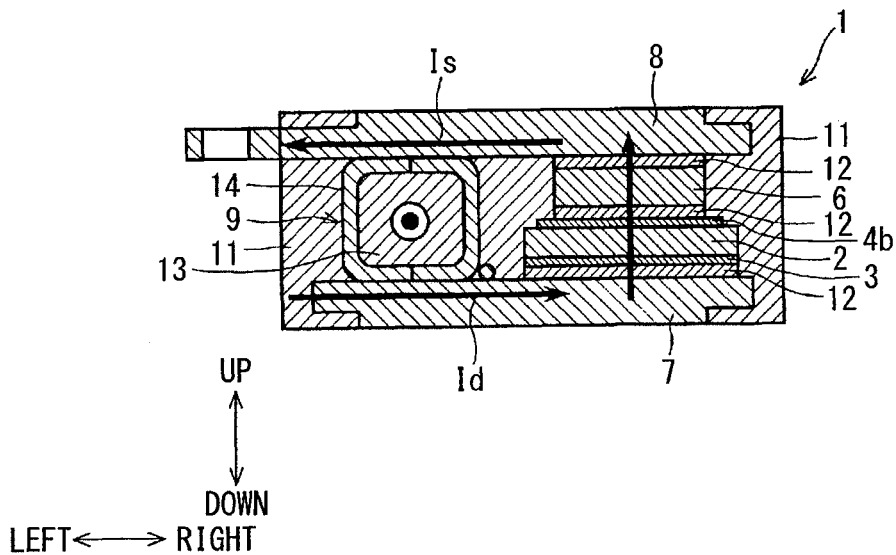
FIG. 2 is a diagram showing a cross sectional view of the semiconductor module taken along line II-II in FIG. 1.
Figure 3:
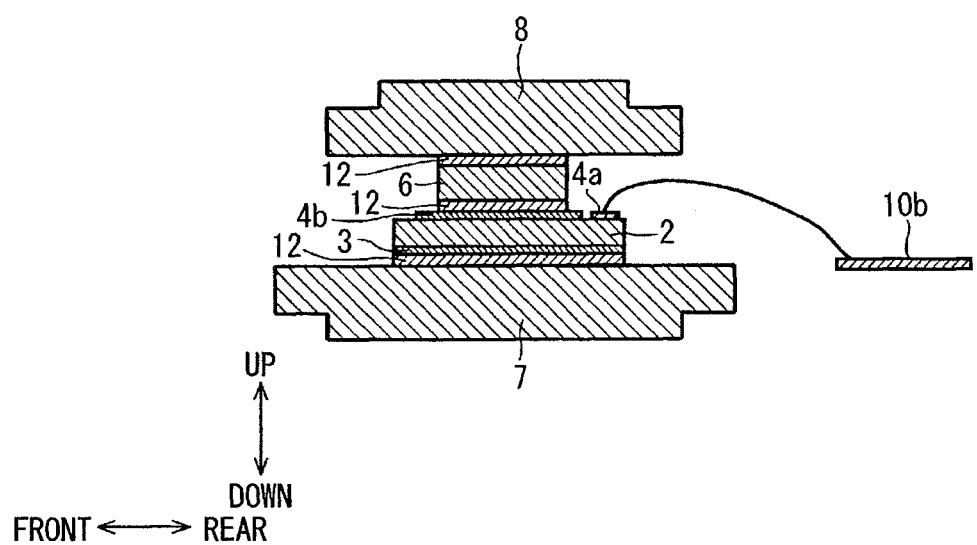
FIG. 3 is a diagram showing a cross sectional view of the semiconductor module taken along line in FIG. 1.
Figure 5:
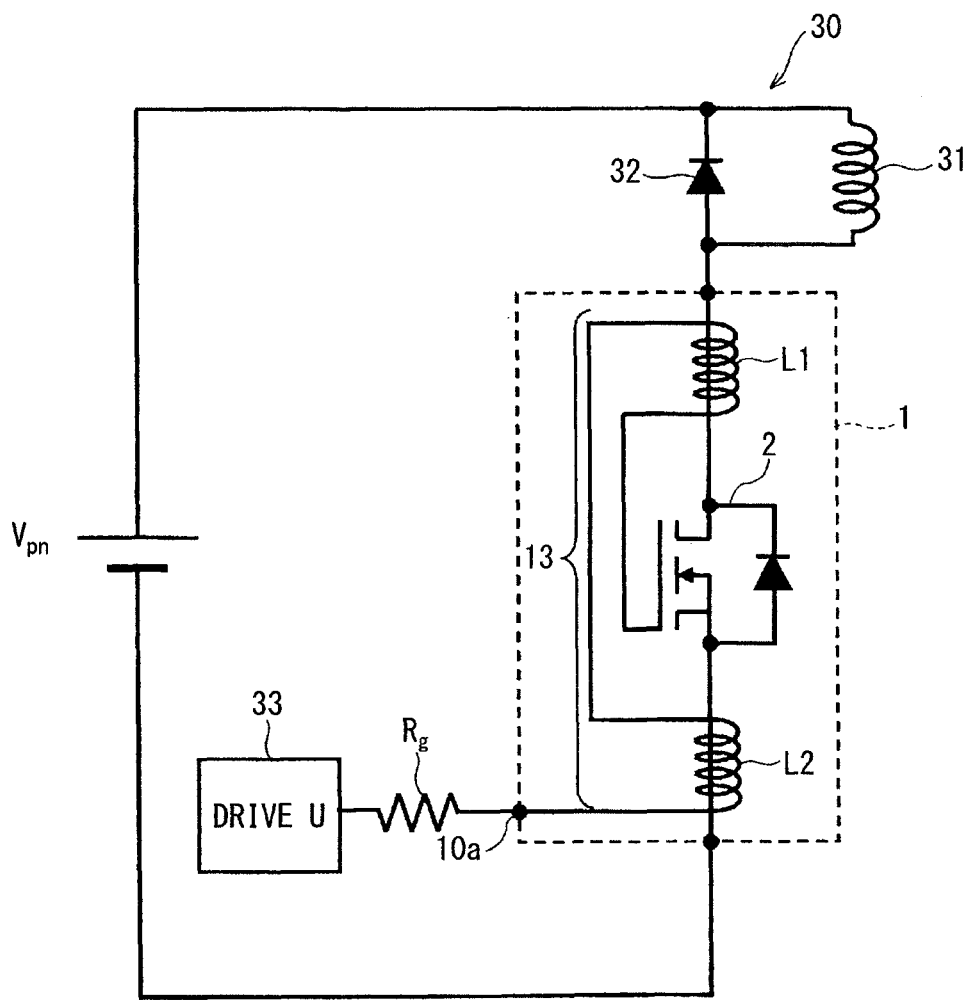
FIG. 5 is a diagram showing an equivalent circuit indicative of a connection of a coil when the semiconductor module is used for a driving device with a switching element.

FIG. 1 shows a plan view of the semiconductor module viewing from an upside of the module. FIG. 2 shows the module taken along line II-II in FIG. 1, and FIG. 3 shows the module taken along line in FIG. 1. FIG. 5 is a circuit diagram showing a case where the module is used for the driving device having the switching element.

The semiconductor module 1 is used for the driving device of the switching element 2 such as a power MOSFET. In the present embodiment, the semiconductor element is the power MOSFET. Alternatively, the semiconductor element may be an IGBT (insulated gate bipolar transistor).

As shown in FIGS. 1 to 3, the semiconductor module 1 includes the semiconductor chip 2, the drain electrode 3, a source electrode 4a for connecting to a control terminal, a source electrode 4b for energizing and radiating heat, a gate electrode 5, a metal block 6, a drain metallic plate (corresponding to a main current wiring) as a first bus bar 7, a source metallic plate (corresponding to a main current wiring) as a second bus bar 8, a winding coil unit (i.e., a coil unit) 9, a lead frame 10a providing a gate control terminal, a lead frame 10b providing a source control terminal and the like. All elements of the module 1 are covered with a resin mold 11. The resin mold 11 is not shown in FIG. 3.

As shown in FIG. 2, the semiconductor module 1 includes the drain metallic plate 7 on an utmost bottom side of the module 1. In the present embodiment, the drain metallic plate 7 has an upper surface, which is a flat surface. The drain metallic plate 7 has a longitudinal direction in a right-left direction of FIG. 2. The semiconductor chip 2 is mounted on a part of the upper surface of the drain metallic plate 7. The winding coil unit 9 is mounted on the other part of the upper surface of the drain metallic plate 7.

The semiconductor chip 2 has a rectangular box shape. A drain of the MOSFET is arranged on a bottom of the chip 2, and a source of the MOSFET is arranged on a top of the chip 2. The chip 2 includes the drain electrode 3 on the bottom of the chip 2, and the drain electrode 3 is bonded to the upper surface of the rain metallic plate 7 through a solder layer 12.

As shown in FIG. 3, the chip 2 has the upper surface, which protrudes from the metal block 6 in a rear direction (i.e., a far side direction). As shown in FIG. 1, the source electrode 4a and the gate electrode 5 are arranged on the upper surface of the chip 2, which protrudes from the block 6.

As shown in FIG. 2, the source electrode 4b is formed on the upper surface of the semiconductor chip 2, which is disposed under the block 6. The metal block 6 for adjusting a height is bonded to the upper surface of the source electrode 4b via the solder layer 12. The source metallic plate 8 is bonded to the upper surface of the metal block 6 via the solder layer 12. In the present embodiment, the source metallic plate 8 has a flat shape on the bottom thereof. The source metallic plate 8 has the longitudinal direction along the right-left direction. The energization direction of the drain metallic plate 7 and the energization direction of the source metallic plate 8 are parallel to each other, for example.

The bottom of the drain metallic plate 7 is an exposed surface. The upper surface of the source metallic plate 8 is an exposed surface. The metal block 6, the drain metallic plate 7 and the source metallic plate 8 have heat conductivity. Thus, the heat generated at the semiconductor chip 2 is radiated from the bottom of the drain metallic plate 7 and the upper surface of the source metallic plate 8. Although not shown, a water cooling element may be attached to the bottom of the drain metallic plate 7 and/or the upper surface of the source metallic plate 8 via an insulation plate so that the cooling performance is improved.

FIG. 2 shows the energization direction of the current I when the MOSFET turns on. As shown in FIG. 2, when the MOSFET turns on, the current flows from the drain electrode 3 to the source electrode 4b. Accordingly, the current Id of the drain metallic plate 7 flows in the right direction of FIG. 2 (i.e., a first positive direction). The current Is of the source metallic plate 8 flows in the left direction of FIG. 2 (i.e., a first negative direction). As shown in FIG. 1, a hole 7z, 8z for a screw is formed in an end portion of each of the drain metallic plate 7 and the source metallic plate 8, respectively. An electric block later described is fixed to the holes 7z, 8z, so that large current flows between the source and the drain of the MOSFET 2.

As shown in FIG. 2, the winding coil unit 9 is prepared such that the coil 14 is wound around the core 13 made of ferrite. The coil 14 is wound dextrally (i.e., in a right-handed manner) from the rear to the front, as shown in FIG. 1. The number of turns of the coil 14 is in a range between 10 turns and 30 turns. A wire of the coil 14 is coated with insulation. Thus, the coil 14 is insulated from the drain metallic plate 7 and the source metallic plate 8.

The winding coil unit 9 is sandwiched between the drain metallic plate 7 and the source metallic plate 8 in the up-down direction. The coil 13 has a longitudinal direction as the front-rear direction (i.e., the second direction). Both ends of the coil 13 are opened in the front-rear direction in FIG. 1.

The magnetic flux interlinked with the winding coil unit 9 mainly enters in the front-rear direction (that is a direction perpendicular to the drawing of FIG. 2) in FIG. 1. The coil 14 of the winding coil unit 9 has one end 14*a*, which is bonded to the lead frame 10*a* as the gate control terminal via the wire 15. The coil 14 has the other end 14*b*, which is bonded to the gate electrode 5 via the wire 16. The source electrode 4*a* for the control is bonded to the lead frame 10*b* via the wire 17. The lead frames 10*a*, 10*b* protrude to the outside of the resin mold 11.

Figure 4A:
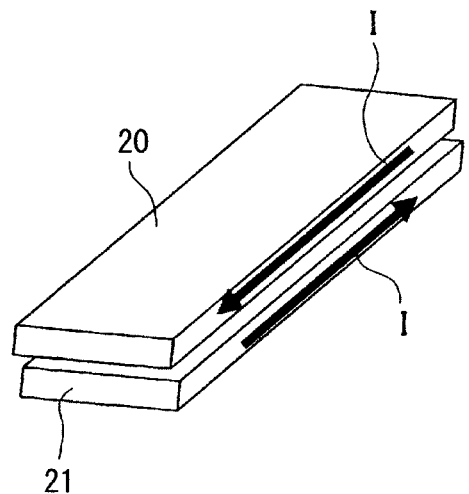
FIGS. 4A and 4B are diagrams showing generated magnetic field according to an energization current.
Figure 4B:
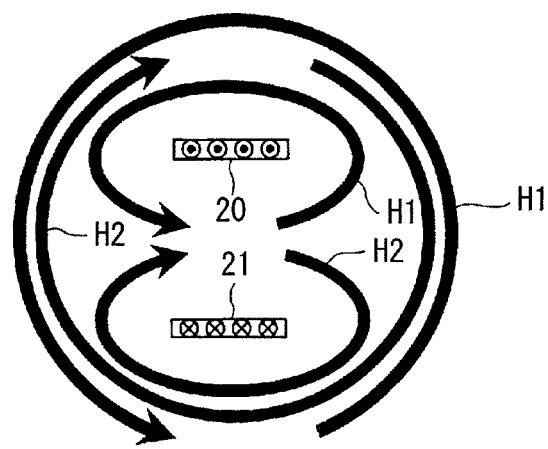

FIGS. 4A and 4B explains the generation of the magnetic field provided by the energization current in the drain metallic plate 7 and the source metallic plate 8. The drain metallic plate 7 and the source metallic plate 8 in FIGS. 1 and 2 are opposed to each other. This relationship between the drain metallic plate 7 and the source metallic plate 8 is shown schematically as FIG. 4A.

As shown in FIG. 4A, a metallic plate 20 and another metallic plate 21 are opposed to each other, and current I flows in each of the metallic plate 20 and the other metallic plate 21 in an opposite direction, respectively. As shown in FIG. 4B, the magnetic field H1 generated around the metallic plate 20 surrounds the metallic plate 20 counter-clockwise (i.e., in a right handed manner) in the energization direction. The magnetic field H2 generated around the other metallic plate 21 surrounds the other metallic plate 21 counter-clockwise (i.e., in a right handed manner) in the energization direction.

Thus, the magnetic fields H1, H2 in an opposing region between the metallic plates 20, 21 are enhanced each other. The magnetic fields H1, H2 in a region other than the opposing region are weakened each other. In view of this point and FIGS. 1 and 2, when the MOSFET 2 turns on so that the current begins to flow between the drain and the source, the enhanced magnetic field provided by the drain metallic plate 7 and the source metallic plate 8 is applied to the arrangement area of the winding coil unit 9. Thus, the strong magnetic field is generated at the core 13 of the winding coil unit 9. Therefore, the high induced electromotive force is generated at the coil 14.

A relationship between the opening direction of the end portion of the core 13 in the winding coil unit 9 and the energization direction of the drain metallic plate 7 and the source metallic plate 8 may be such that the opening direction and the energization direction intersect with each other on a plane (i.e., the front-rear direction and the right-left direction). Specifically, the opening direction and the energization direction intersect with each other perpendicularly.

In this case, the applied magnetic field of the core 13 is maximized.

Further, as shown in FIG. 1, a width of the source metallic plate 8 in the front-rear direction is narrower than a width of the drain metallic plate 7 in the front-rear direction. The length X1 between end portions of the coil 14 in the front-rear direction may be equal to or smaller than the width of the drain metallic plate 7 in the front-rear direction and equal to or smaller than a width of the source metallic plate 8 in the front-rear direction. The winding unit of the coil 14 may be arranged within the width of the source metallic plate 8 in the front-rear direction. In this case, the generated magnetic field of the source metallic plate 8 effectively provides the induced electromotive force at the coil 14. Thus, a S/N ratio (a signal to noise ratio) is improved.

The inventors prepared a driving device 30, in which the semiconductor module 1 is used, according to the above principle. An example of the driving device 30 is shown in FIG. 5. Alternatively, various circuits may be prepared as the driving device 30, in which the semiconductor module 1 is used. The semiconductor is electrically shown as an equivalent circuit in FIG. 5. As shown in FIG. 5, the inductors L1, L2 in the winding coil unit 9 provides a mutual coupling effect to the drain terminal and the source terminal of the MOSFET 2.

The example of a circuit diagram in FIG. 5 shows the driving device 30 with an inductive load 31. In the driving device 30, the inductive load 31 and the source and the drain of the MOSFET 2 are connected between both ends of the direct current power source Vpn, and the inductive load 31 is connected in parallel to the reflux diode 32. In this case, in view of a mounting manner, the inductive load 31, the drain metallic plate 7 and the source metallic plate 8 are connected in series between both ends of the direct current power source Vpn, and the reflux diode 32 is reversely connected to both ends of the inductive load 31.

The drive unit 33 of the driving device 30 is connected to the lead frames 10*a*, 10*b* of the semiconductor module 1 via the gate resistor Rg. The drive unit 33 outputs a pulse signal to the gate and the source of the MOSFET 2 via the coil 14 of the winding coil unit 9.

Figure 6:
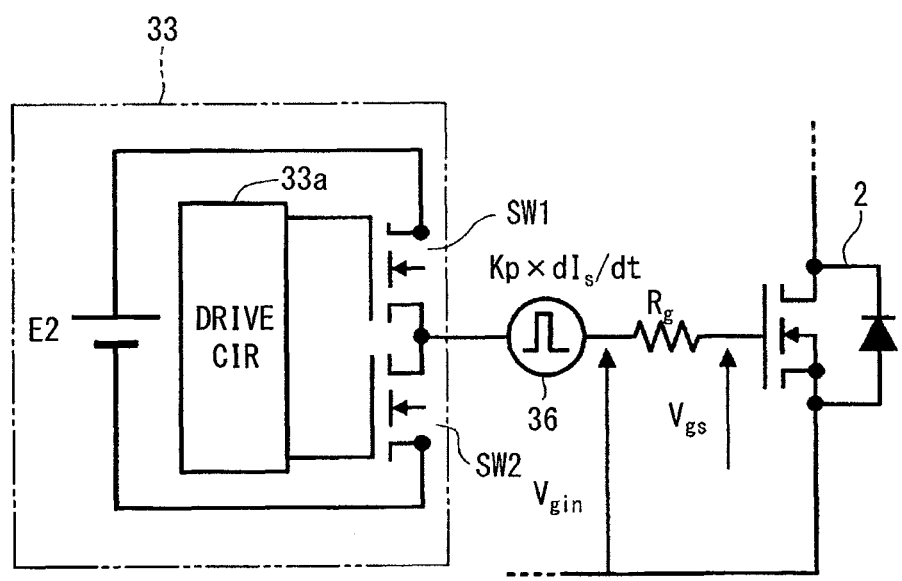
FIG. 6 is a diagram showing an equivalent circuit indicative of an electric constitution of an induced voltage to be applied.
Figure 7:
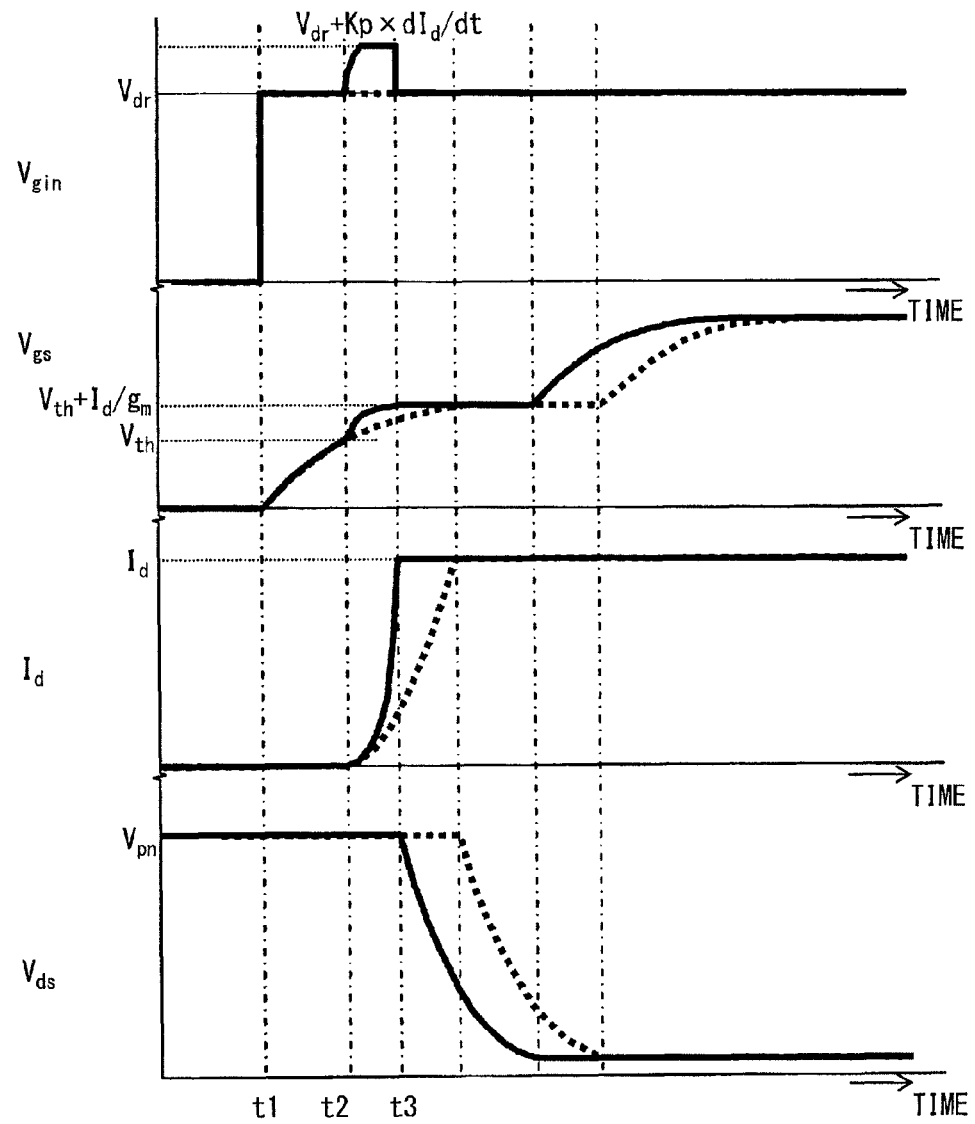
FIG. 7 is a timing chart showing a turn-on operation of the switching element.

FIG. 6 shows an equivalent circuit when the drive unit 33 applies the pulse signal between the gate and the source of the MOSFET 2. FIG. 7 shows response characteristics. A broken line in FIG. 7 shows a characteristic without the winding coil unit 9. A solid line in FIG. 7 shows a characteristic with the winding coil unit 9.

As shown in FIG. 6, the drive unit 33 includes two switches SW1, SW2, which are connected in series between both ends of the driving circuit 33*a* and both ends of the direct current power source E2. The driving circuit 33*a* applies the driving signal to each of the gates of the switches SW1, SW2. The driving unit 33 is connected to the gate of the MOSFET 2 via the gate resistor Rg and a common connection node of the switches SW1, SW.

The inductors L1, L2 provided by the winding coil unit 9 (shown in FIG. 5) and various gate parasitic capacitances (not shown) exists at the gate of the MOSFET 2. Accordingly, the pulse signal voltage 36 as the induced electromotive force caused by the above features is applied to and overlapped to the gate of the MOSFET 2 via the gate resistor Rg.

When the driving circuit 33*a* turns on the switch SW1, and turns off the switch SW2, as shown in FIG. 7, the driving circuit 33*a* applies the step voltage Vdr to the gate of the MOSFET 2 with the direct current power source E2. Thus, the gate input capacitor of the MOSFET 2 is charged with electric charges, and a voltage between the gate and the source of the MOSFET 2 gradually increases, as shown in a time interval between time t1 and time t2 in FIG. 7.

In the time interval between time t1 and time t2, the drain current Id of the MOSFET 2 does not flow. After that, the voltage Vgs between the gate and the source in the MOSFET 2 exceeds the threshold voltage Vth, the gate drive voltage rapidly increases, so that the charge to the gate input capacitor is facilitated. Thus, the drain current Id rapidly increases. Accordingly, the induced electromotive voltage depending on the source current Is (that is almost equal to the drain current Id) is overlapped as the pulse signal voltage 36 toward the positive direction, as shown in a time interval between time t2 and time t3 in FIG. 7. Here, the induced electromotive voltage is calculated by an equation of Kp×dIs/dt. Thus, the increase rates of the drain current Id and the source current Is are enhanced, so that the switching speed of the MOSFET 2 is improved. Although the increase rate of the drain current Id is enhanced, when the drain current Id reaches an upper limit, the induced electromotive voltage is not generated since the current does not substantially changes. Accordingly, the rate of the voltage drop of the voltage Vds between the drain and the source does not depend on existence and non-existence of the winding coil unit 9 (please refer to the voltage Vds between the drain and the source in FIG. 7).

In the present embodiment, the drain metallic plate 7 is opposed to the source metallic plate 8, and the energization directions (i.e., the flowing directions) of the current in the metallic plates 7, 8 are opposite to each other. Thus, the magnetic field generated between the drain metallic plate 7 and the source metallic plate 8 is enhanced, so that the magnetic field is generated strongly at the core 13 in the winding coil unit 9.

The winding coil unit 9 generates the induced electromotive voltage at the coil 14 according to the strong magnetic field. For example, when the semiconductor module 1 is used for the driving device 30 with the inductive load 31, the increase rate of the drain current Id in the MOSFET 2 is enhanced, so that the MOSFET 2 provides a high speed switching operation.

In the prior art (such as JP-A-2008-235997), since the core is arranged around the lead wire, it is necessary to prepare enough arrangement space. In the present embodiment, since the winding coil unit 9 is sandwiched between the drain metallic plate 7 and the source metallic plate 8 as the main current wiring, the arrangement space for the winding coil unit 9 is provided sufficiently, so that the dimensions of the device are minimized, and it is easy to save space. Further, since the winding coil unit 9 is sandwiched between the drain metallic plate 7 and the source metallic plate 8, the winding coil unit 9 is easily fixed. Further, since the winding coil unit 9 is sandwiched between the drain metallic plate 7 and the source metallic plate 8, so that the dimensions of the device are minimized, the parasitic inductance is reduced.

The length X1 between both ends of the coil 14 is equal to or smaller than the width of the drain metallic plate 7 in the front-rear direction and equal to or smaller than a width of the source metallic plate 8 in the front-rear direction. Accordingly, the magnetic field generated by the drain metallic plate 7 and the source metallic plate 8 as a main current path is effectively applied to the core 13 of the winding coil unit 9. Thus, the high induced electromotive force is generated even if the dimensions of the winding coil unit 9 are small.

Further, since the semiconductor chip 2 is sandwiched between the drain metallic plate 7 and the source metallic plate 8, the arrangement space for the semiconductor chip 2 is minimized, so that the space is saved. Each of the drain metallic plate 7 and the source metallic plate 8 has the exposure surface, which is different from the sandwiching surface of the winding coil unit 9. Thus, the semiconductor chip 2 is effectively cooled.

(Second Embodiment)

Figure 8:
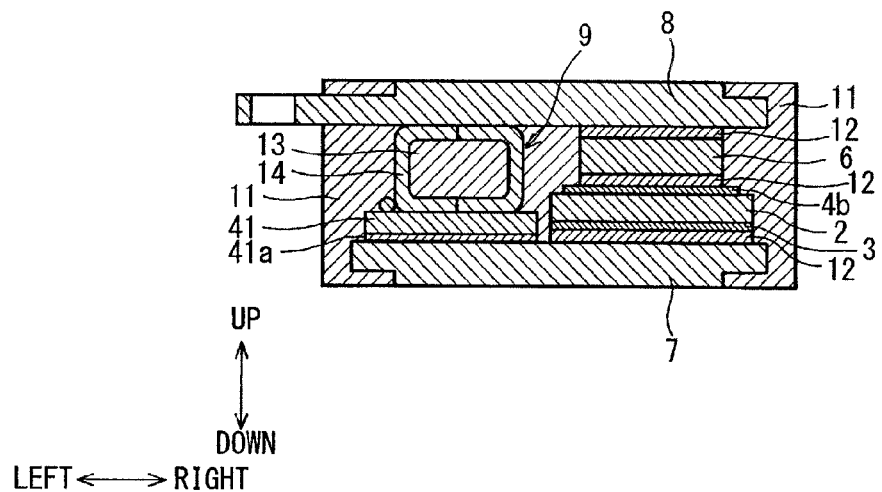
FIG. 8 is a diagram showing a cross sectional view of a semiconductor module according to a second embodiment.

FIG. 8 shows a semiconductor module according to a second embodiment. The difference between the first and second embodiments is such that an insulation plate 41 as an insulator is arranged between the winding coil unit 9 and the drain metallic plate 7. In the first embodiment, the coil is prepared by covering a core wire with an insulation layer. Here, a voltage about a few hundreds volt such as 600 volts is applied to the drain metallic plate 7. However, a voltage less than the voltage to the drain metallic plate 7 is applied to the source metallic plate 8.

Accordingly, to maintain the insulation property between the drain metallic plate 7 and the coil 14, as shown in FIG. 8, the insulation plate 41 is arranged between the winding coil unit 9 and the drain metallic plate 7 via a connection member 41*a*. Thus, the insulation property is highly improved. Alternatively, the insulation plate 41 may not be arranged between the source metallic plate 8 and the coil 14.

(Third Embodiment)

Figure 9:
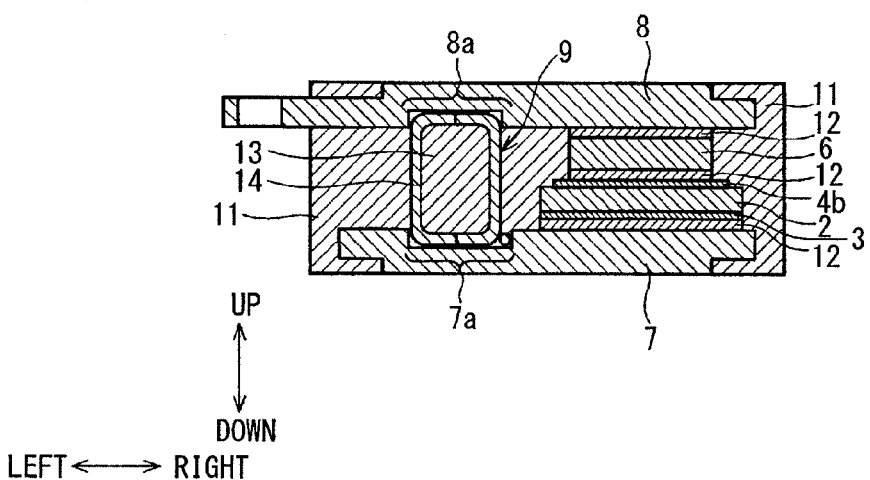
FIG. 9 is a diagram showing a cross sectional view of a semiconductor module according to a third embodiment.
Figure 10:
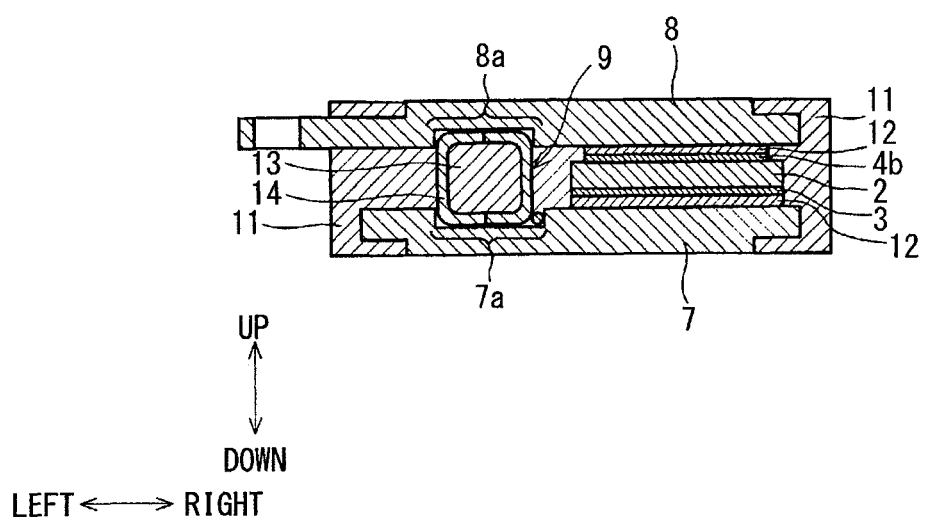
FIG. 10 is a diagram showing a cross sectional view of a semiconductor module.

FIGS. 9 and 10 show a semiconductor module according to a third embodiment. The difference between the second and third embodiments is such that a concavity is arranged on the drain metallic plate and/or the source metallic plate so as to face the arrangement space of the coil unit. Thus, the coil unit is held in the concavity.

As shown in FIG. 9, the concavity 7*a* is formed in a part of the upper surface of the drain metallic plate 7. The concavity 7*a* provides the arrangement space of the winding coil unit 9. The concavity 7*a* has a dimension in the right-left direction of the cross sectional view of FIGS. 9 and 10, which is slightly larger than a bottom side of the winding coil unit 9. Further, another concavity 8*a* is formed in a part of the lower surface of the source metallic plate 8.

The concavity 8*a* has a dimension in the right-left direction of the cross sectional view of FIGS. 9 and 10, which is slightly larger than a top side of the winding coil unit 9. The concavity 8*a* is opposed to the concavity 7*a*. The top side and the bottom side of the winding coil unit 9 are engaged in the concavities 7*a*, 8*a*, respectively. Thus, the winding coil unit 9 is sandwiched between the concavities 7*a*, 8*a*.

In the above structure, when the winding coil unit 9 is assembled between the drain metallic plate 7 and the source metallic plate 8, the positioning of the winding coil unit 9 in the right-left direction in FIG. 9 is determined by engaging the winding coil unit 9 in the concavities 7*a*, 8*a* so that the displacement of the winding coil unit 9 is restricted in the right-left direction of FIG. 9. Further, the parasitic inductance is much reduced, compared with a case in the first and second embodiments since the mutual induction effect derived from the drain metallic plate 7 and the source metallic plate 8 becomes large. When the semiconductor module 1 I used for the driving device 30 of the switching element, the surge voltage is restricted.

In the present embodiment, the winding coil unit 9 is engaged in the concavities 7*a*, 8*a*, so that the winding coil unit 9 is assembled. Further, as shown in FIG. 10, even if the dimension of the winding coil unit 9 is short in the up-down direction, the metal block 9 for adjusting the height may not be arranged as long as the certain properties are obtained.

(Fourth Embodiment)

Figure 11:
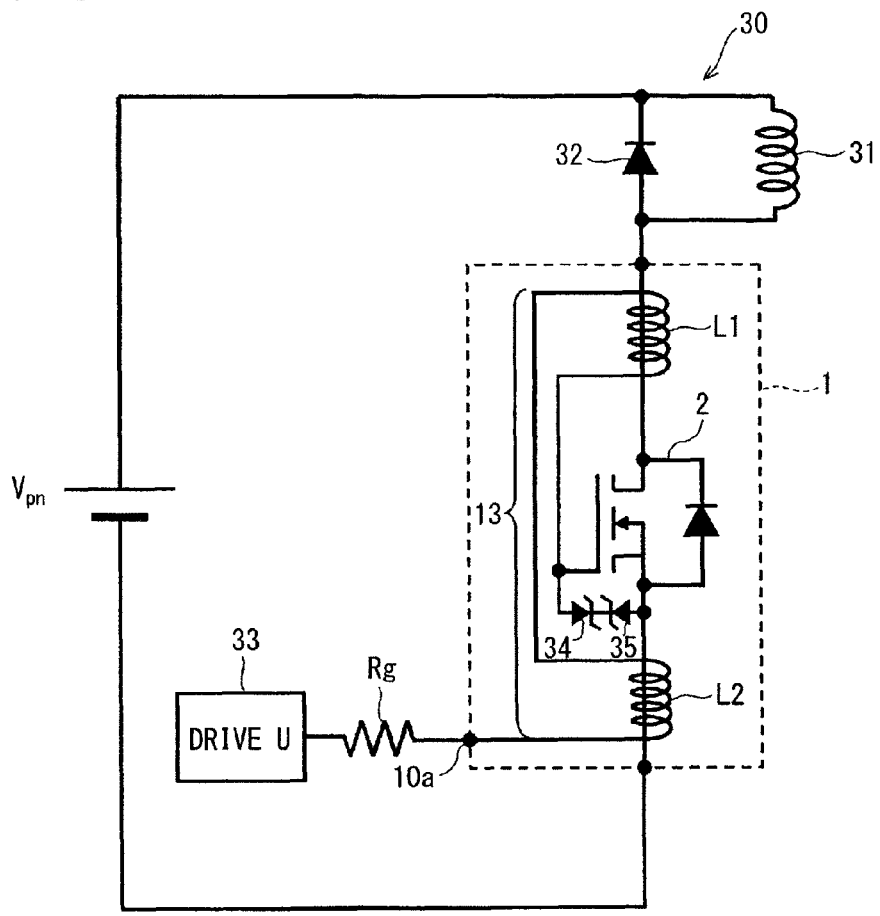
FIG. 11 is a circuit diagram showing an equivalent circuit indicative of a connection of a coil with a clamp diode when the semiconductor module is used for a driving device with a switching element.

FIG. 11 shows a semiconductor module according to a fourth embodiment. The difference between the third and fourth embodiments is such that diodes 34, 35 for clamping are arranged between the gate and the source of the MOSFE 2.

If excess current may be generated at the coil 14 of the coil unit 9, a Zener 34, 35 may clamp the induced electromotive force generated at the winding coil 14. In this embodiment, as shown in FIG. 11, the Zener diodes 34, 35 are connected between the gate and the source of the MOSFET 2 such that the Zener diodes 34, 35 are oppositely connected in a reverse direction. Thus, when the induced electromotive force is generated at the coil 14, the Zener voltage Vz clamps so that the MOSFET 2 is protected from the excess current.

(Other Embodiments)

Figure 12:
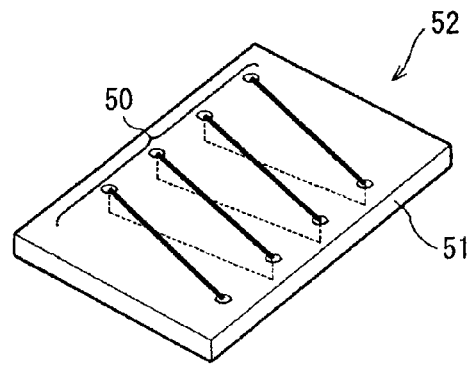
FIG. 12 is a diagram showing a coil unit according to other embodiment.

In the above embodiments, the coil 14 is wound around the core 13, so that the coil 14 with the core 13 is sandwiched between the drain metallic plate 7 and the source metallic plate 8. Alternatively, the coil 14 may not include the core 13. Alternatively, a substrate coil 52 shown in FIG. 12 may be used. The substrate coil 52 is prepared such that a coil pattern 50 corresponding to the coil is formed on each surface of the printed wiring board 51.

For example, when the substrate coil 52 instead of the winding coil unit 9 is arranged, a side of the printed wiring board 51 is arranged along the front-rear direction or the right-left direction of FIG. 1. Thus, the space is saved. The substrate coil 52 instead of the unit 9 may be applied to the second to fourth embodiment. In these cases, the similar effects are obtained.

In the above embodiments, the drain metallic plate 7 and the source metallic plate 8 are arranged in parallel to each other in the up-down direction. It is not necessary to arrange in parallel to each other strictly. For example, the distance of a right side between the drain metallic plate 7 and the source metallic plate 8 in the up-down direction may be different from a left side.

In the above embodiments, the semiconductor element is the power MOSFET. Alternatively, the semiconductor element may be a IGBT (insulated gate bipolar transistor) having a gate, a collector and an emitter.

In the above embodiments, the energization direction of the source metallic plate 8 is opposite to the drain metallic plate 7 (i.e., the difference between the energization direction of the source metallic plate 8 and the drain metallic plate 7 is 180 degrees). It is not necessary to arrange the energization direction of the source metallic plate 8 and the drain metallic plate 7 to be the opposite direction strictly. For example, the difference between the energization direction of the source metallic plate 8 and the drain metallic plate 7 may be 90 degrees on a certain plane. In the above embodiments, the semiconductor module 1 is used for the driving device 30 for driving the inductive load 31. Alternatively, the semiconductor module 1 may be used for an inverter, a DC-DC converter, various driving devices, and the like. The number of turns of the coil and/or the width of the coil may be appropriately determined.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor module comprising:
   a semiconductor element having a switching element with a control terminal;
   first and second main current passages for energizing the semiconductor element, the first and second main current passages being opposed to each other in such a manner that a first energization direction of the first main current passage is opposite to a second energization direction of the second main current passage, or an angle between the first energization direction and the second energization direction is an obtuse angle; and
   a coil unit sandwiched between the first and second main current passages,
   wherein the coil unit includes a coil, which generates an induced voltage when a magnetic flux interlinks with the coil, the magnetic flux being generated when current flows through the first and second main current passages, and
   wherein the induced voltage is overlapped on an applied voltage of the control terminal of the switching element.

2. The semiconductor module according to claim 1,
   wherein the first main current passage includes a first concavity, and the second main current passage includes a second concavity,
   wherein the first concavity provides an arrangement space of the coil unit, and the second concavity provides an arrangement space of the coil unit, and
   wherein the coil unit is sandwiched between the first concavity and the second concavity, which are opposed to each other.

3. The semiconductor module according to claim 1, further comprising:
   an insulator arranged between the coil unit and each main current passage.

4. The semiconductor module according to claim 1,
   wherein the coil has a length between both winding ends of the coil,
   wherein the length of the coil is equal to or smaller than a passage width of each main current passage, and
   wherein the coil unit is arranged within the passage width of each main current passage.

5. The semiconductor module according to claim 1,
   wherein the semiconductor element is arranged between the first main current passage and the second main current passage, which are opposed to each other.

6. The semiconductor module according to claim 1,
   wherein the first main current passage has a facing surface and an exposure surface, which is different from the facing surface,
   wherein the second main current passage has a facing surface and an exposure surface, which is different from the facing surface,
   wherein the facing surface of the first main current passage is opposed to the facing surface of the second main current passage,
   wherein the coil unit is sandwiched between the facing surface of the first main current passage and the facing surface of the second main current passage, and
   wherein the exposure surface of the first main current passage is exposed from the semiconductor module in order to cool the semiconductor element, and the exposure surface of the second main current passage is exposed from the semiconductor module in order to cool the semiconductor element.

7. The semiconductor module according to claim 1,
   wherein the coil unit is a winding coil unit, which includes the coil and a core, and
   wherein the core is inserted into the coil.

8. A driving device for driving a switching element comprising:
   a semiconductor element in a semiconductor module, which is the switching element having a gate as a control terminal, a drain or a collector, and a source or an emitter,
   wherein the semiconductor element is energized by first and second main current passages,
   wherein the first and second main current passages are opposed to each other in such a manner that a first energization direction of the first main current passage is opposite to a second energization direction of the second main current passage, or an angle between the first energization direction and the second energization direction is an obtuse angle,
   wherein a coil unit is sandwiched between the first and second main current passages,
   wherein the coil unit includes a coil, which generates an induced voltage when a magnetic flux interlinks with the coil, the magnetic flux being generated when current flows through the first and second main current passages, wherein the gate, the drain or the collector and the source or the emitter are electrically connected to each other so as to be coupled in a mutual induction manner, and wherein the induced voltage generated at the coil unit is overlapped on an applied voltage of the gate of the switching element.

9. The driving device according to claim 8, further comprising:

a Zener diode for clamping the induced voltage.

* * * * *